United States Patent
Ghyselen et al.

(10) Patent No.: US 11,557,715 B2
(45) Date of Patent: Jan. 17, 2023

(54) METHOD FOR MANUFACTURING A FILM ON A FLEXIBLE SHEET

(71) Applicant: Soitec, Bernin (FR)

(72) Inventors: Bruno Ghyselen, Seyssinet (FR); Jean-Marc Bethoux, La Buisse (FR)

(73) Assignee: Soitec, Bernin (FR)

( * ) Notice: Subject to any disclaimer, the term of this patent is extended or adjusted under 35 U.S.C. 154(b) by 253 days.

(21) Appl. No.: 16/759,992

(22) PCT Filed: Oct. 31, 2018

(86) PCT No.: PCT/EP2018/079796
§ 371 (c)(1),
(2) Date: Apr. 28, 2020

(87) PCT Pub. No.: WO2019/086503
PCT Pub. Date: May 9, 2019

(65) Prior Publication Data
US 2020/0343441 A1    Oct. 29, 2020

(30) Foreign Application Priority Data
Oct. 31, 2017   (FR) ...................................... 1760272

(51) Int. Cl.
*H01L 41/313* (2013.01)
*H01L 21/265* (2006.01)
*H01L 41/187* (2006.01)

(52) U.S. Cl.
CPC ...... *H01L 41/313* (2013.01); *H01L 21/26506* (2013.01); *H01L 41/187* (2013.01)

(58) Field of Classification Search
CPC    H01L 41/313; H01L 41/187; H01L 21/26506
See application file for complete search history.

(56) References Cited

U.S. PATENT DOCUMENTS

| 6,100,166 | A | 8/2000 | Sakaguchi et al. |
| 6,346,458 | B1 | 2/2002 | Bower |
| 6,562,127 | B1 | 5/2003 | Kud et al. |
| 6,974,760 | B2 * | 12/2005 | Ghyselen .......... H01L 21/02032 |
| | | | 438/464 |
| 9,427,948 | B2 * | 8/2016 | Moriceau ................. B32B 3/02 |
| 2004/0224482 | A1 | 11/2004 | Kub et al. |
| 2006/0019476 | A1 | 1/2006 | Lagahe et al. |

FOREIGN PATENT DOCUMENTS

FR         3041364         10/2017

OTHER PUBLICATIONS

Chinese Office Action and Search Report for Chinese Application No. 107138588 dated Mar. 3, 2022, 12 pages with translation.
International Search Report for International Application No. PCT/EP2018/079796 dated Jan. 18, 2019, 3 pages.
International Written Opinion for International Application No. PCT/EP2018/079796 dated Jan. 18, 2019, 5 pages.

* cited by examiner

*Primary Examiner* — Mark V Prenty
(74) *Attorney, Agent, or Firm* — TraskBritt

(57) ABSTRACT

A method for manufacturing a film, notably monocrystalline, on a flexible sheet, comprises the following steps: providing a donor substrate, forming an embrittlement zone in the donor substrate so as to delimit the film, forming the flexible sheet by deposition over the surface of the film, and detaching the donor substrate along the embrittlement zone so as to transfer the film onto the flexible sheet.

24 Claims, 5 Drawing Sheets

METHOD FOR MANUFACTURING A FILM ON A FLEXIBLE SHEET

CROSS-REFERENCE TO RELATED APPLICATIONS

This application is a national phase entry under 35 U.S.C. § 371 of International Patent Application PCT/EP2018/079796, filed Oct. 31, 2018, designating the United States of America and published as International Patent Publication WO 2019/086503 A1 on May 9, 2019, which claims the benefit under Article 8 of the Patent Cooperation Treaty to French Patent Application Serial No. 1760272, filed Oct. 31, 2017.

TECHNICAL FIELD

The present disclosure relates to a method for manufacturing a film, notably monocrystalline, on a flexible sheet.

BACKGROUND

The formation of a film, notably monocrystalline, on a flexible sheet is not easy to accomplish.

Indeed, the flexible sheets of interest do not in general have a seed surface suited to the growth of a film of good crystalline quality.

Furthermore, techniques of bonding a film on a flexible sheet are also difficult to implement, because the surfaces to be placed in contact may not be sufficiently smooth to enable direct bonding. On the other hand, the flexibility of the sheet makes good application against the film difficult.

Furthermore, numerous adhesives would be unsuitable in view of their too high rigidity in view of the application. These adhesives may also prove to be unsuitable in view of their incompatibility with the heat treatments that can be necessary for shaping the monocrystalline film.

BRIEF SUMMARY

One aim of the present disclosure is thus to conceive a method for manufacturing a thin film, notably monocrystalline, on a flexible sheet, while ensuring good mechanical strength of the transferred layer vis-à-vis the receiving sheet.

To this end, the present disclosure describes a method for manufacturing a film, notably monocrystalline, on a flexible sheet, which comprises the following steps:
  providing a donor substrate,
  forming an embrittlement zone in the donor substrate so as to delimit the film,
  forming the flexible sheet by deposition on the surface of the film, and
  detaching the donor substrate along the embrittlement zone, so as to transfer the film onto the flexible sheet.

"Flexible" is taken to mean in the present text a sufficiently low rigidity to allow an elastic deformation during the application of external mechanical stresses. Typically, for the targeted applications, the rigidity is less than or equal to $10^6$ GPa.µm$^3$.

Depending on the targeted applications, a certain flexibility may be sought because the targeted object is capable or has to be able to deform without deteriorating, such as, for example, a chip card or instead a patch that has to follow the movements of the part of the human body on which it is applied. A certain flexibility may also be sought because the object is intended to be applied in a permanent manner on a surface with fixed but curved geometry, such as, for example, bottles, cylindrical recipients, windscreens, etc.

According to one embodiment, the formation of the embrittlement zone is carried out by implantation of ionic species in the donor substrate.

The implanted ionic species are advantageously hydrogen and/or helium.

According to one embodiment, the detachment of the donor substrate is caused by a heat treatment.

In a particularly advantageous manner, the film is made of a material selected from semiconductor materials, piezoelectric materials, magnetic materials and functional oxides.

The thickness of the film is generally between 100 nm and 10 µm, preferably between 100 nm and 1 µm.

Advantageously, the flexible sheet is made of a material selected from metals, glasses and ceramics.

The thickness of the flexible sheet is generally between 1 and 50 µm.

The deposition of the flexible sheet may be implemented by one of the following techniques: physical vapor deposition, chemical vapor deposition, electrochemical deposition, spin coating, lacquering and spraying.

Preferably, the flexible sheet has a rigidity R between 100 GPa.µm$^3$ and $10^6$ GPa.µm$^3$, the rigidity being defined by the formula:

$$R = \frac{E \times H^3}{12 \times (1 - v^2)}$$

where E is the Young's modulus of the material of the sheet, H the thickness of the sheet and v the Poisson coefficient.

The method may comprise, before the formation of the flexible sheet, the formation of an intermediate layer by deposition on the surface of the film.

According to one embodiment, the intermediate layer may be configured to increase the adherence of the flexible sheet vis-à-vis the film.

Optionally, the intermediate layer may form an electrical contact with the film.

Furthermore, the method may comprise, after the detachment of the donor substrate, the deposition of an additional film on the face of the transferred film opposite to the support.

Advantageously, the residue of the donor substrate at the end of the detachment is recycled with a view to the implementation of a new film.

In the case where the donor substrate has a non-flat surface obtained before the formation of the embrittlement zone, before the recycling, the residue of the donor substrate is subjected to an operation of regeneration of its surface involving a removal of material that is substantially zero or conforming to the topology of the residue.

According to one embodiment, the donor substrate comprises a plurality of pads laid out on the surface of a wafer, each pad comprising an embrittlement zone delimiting a respective film to transfer, and the flexible sheet is deposited on the surface of the pads.

BRIEF DESCRIPTION OF THE DRAWINGS

Other characteristics and advantages of the present disclosure will become clear from the detailed description that follows, with reference to the appended drawings, in which.

For reasons of legibility of the figures, the different elements are not necessarily represented to scale. Reference signs present from one figure to the next represent the same elements.

DETAILED DESCRIPTION

Generally speaking, the present disclosure provides for the formation of the flexible sheet by deposition on a donor substrate that has been embrittled beforehand so as to delimit a thin film. The thin film is next transferred onto the flexible sheet by detachment of the donor substrate. The sheet may be constituted of a single material or a stack of at least two different materials, deposited successively on the donor substrate.

Figure 1A:
FIG. 1A is a schematic cross-sectional view of a donor substrate.

FIG. 1A illustrates a donor substrate 10, which comprises at least one superficial portion constituted of the material intended to form the thin film. Although the donor substrate is represented in the form of a bulk substrate, it could also be formed of a stack of layers of different materials, of which a superficial layer constituted of the material intended to form the thin film. In particular, the thin film may correspond to a layer of this stack produced by epitaxy.

Advantageously, the material intended to form the thin film is selected from: semiconductor materials (e.g., silicon, silicon carbide, germanium, III-V compounds such as AsGa, InP, GaN, II-VI compounds such as CdTe, ZnO), piezoelectric materials (e.g., LiNbO$_3$, LiTaO$_3$, PZT, PMN-PT), magnetic materials and functional oxides (e.g., ZrO$_2$, YSZ: yttrium stabilized ZrO$_2$SrTiO$_3$, GaO$_2$). These examples are not limiting.

Preferably, the material intended to form the thin film is monocrystalline. It may also be polycrystalline, and in this case emphasis is often placed on optimizing its conditions of formation in order to obtain, for example, a particular density and a size of crystalline grains and/or a preferential crystalline orientation, and/or an optimized roughness.

Figure 1B:
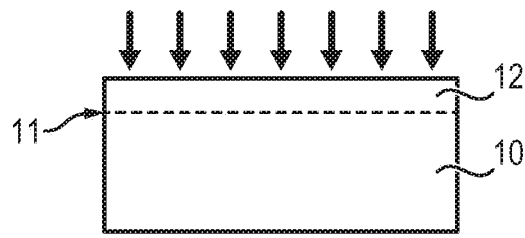
FIG. 1B illustrates in a schematic manner the formation of an embrittlement zone in the donor substrate of FIG. 1A.

With reference to FIG. 1B, an embrittlement zone 11, which delimits a superficial film 12 intended to be transferred, is formed in the donor substrate 10.

The thickness of the transferred film is defined by the depth of the embrittlement zone 11 in the donor substrate 10. Advantageously, this depth is between 100 nm and 10 µm, preferentially between 100 nm and 1 µm.

The formation of the embrittlement zone 12 in the donor substrate 10 may be carried out by implantation of ionic species (shown schematically by the arrows in FIG. 1B). Advantageously, the implanted species are hydrogen ions and/or helium ions. The implantation energy makes it possible to define the depth of the embrittlement zone 11. The implantation dose is chosen in order to enable the detachment of the film 12 after the application of a suitable treatment. The implantation dose is chosen sufficiently low so as not to induce the formation of bubbles as of the implantation step. The ionic species, the energy and the implantation dose are chosen as a function of the material of the donor substrate 10. These conditions have been the subject of numerous publications and are known in the art.

Figure 1C:
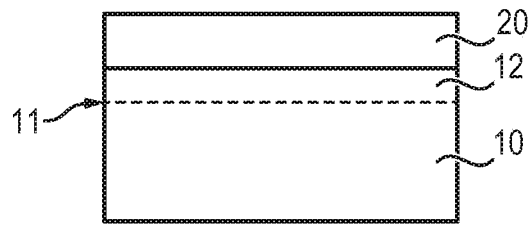
FIG. 1C illustrates in a schematic manner the deposition of the flexible receiving sheet on the donor substrate of FIG. 1B.

With reference to FIG. 1C, a flexible sheet 20 is formed on the surface of the film 12, which, at this stage, still forms part of the donor substrate 10.

In contrast to bonding techniques, the flexible sheet is not a separate, previously formed structure, but instead is formed directly on the donor substrate. The following deposition techniques may be implemented for the formation of the film: physical vapor deposition (PVD), chemical vapor deposition (CVD), deposition by electrodeposition or electroforming (electroplating or electrochemical deposition (ECD)), spin coating, lacquering and spraying. These techniques are known per se and will not be described in greater detail here, those skilled in the art being capable of selecting the most suitable technique as a function of the material of the flexible sheet. Deposition techniques at relatively low temperature are preferred, in order avoid initiating premature detachment of the donor substrate.

The flexible sheet is advantageously made of a material selected from metals (e.g., Ni, Cu, Cr, Ag, Fe, Co, Zn, Al, Mo, W and alloys thereof), glasses and ceramics (e.g., silica (SiO$_2$), alumina (Al$_2$O$_3$), polycrystalline AlN, polycrystalline silicon, polycrystalline SiC). These examples are not limiting.

The thickness of the flexible sheet is typically between 1 and 50 µm.

The rigidity of the sheet has to be sufficiently low to ensure the flexibility of the sheet with regard to the targeted application, but sufficiently high to enable in a first instance the transfer of the film 12 onto the sheet 20, and to do so without formation of blisters.

The rigidity R may be estimated by the formula:

$$R = \frac{E \times H^3}{12 \times (1 - v^2)}$$

where E is the Young's modulus of the material of the sheet, H the thickness of the sheet and v the Poisson coefficient.

Sufficiently low rigidity to ensure flexibility is taken to mean a rigidity less than or equal to $10^6$ GPa.µm$^3$. As an indication, it will be noted that the rigidity of a layer of 43 µm of silicon is around $10^6$ GPa.µm$^3$, whereas the rigidity of a layer of 92 µm of silicon is around $10^7$ GPa.µm$^3$.

Sufficiently high rigidity to avoid the formation of blisters during the transfer is taken to mean a rigidity greater than or equal to 100 GPa.µm$^3$.

Furthermore, care is taken to ensure that the adherence of the sheet on the donor substrate is sufficient to avoid the detachment of the sheet during the film transfer method. This adherence may be improved by the deposition of an adhesion layer on the donor substrate before the deposition of the sheet. For example, such an adhesion layer may be made of one of the following materials: Ti, Cr, Pt, Ta, TiW, $Si_3N_4$, TiN, CrCu.

More generally, at least one intermediate layer may be deposited on the film 12 before the deposition of the flexible sheet. It may also be, in particular, a stack of layers. Apart from a potential adhesion function, such an intermediate layer or stack may notably have the function of avoiding the diffusion of chemical species to the film 12 during the deposition of the sheet 20, and/or to form an electrical contact on the film 12, and/or to form an optical index variation, and/or to form a reflective layer such as a Bragg mirror and/or instead minimize a discontinuity in acoustic impedance. Naturally, those skilled in the art are capable of choosing the suitable materials and their thickness according to the mechanical, electrical, optical, thermal, acoustic or chemical function of the intermediate layer or stack.

The thickness of the intermediate layer(s) remains sufficiently low so that the rigidity of this layer or stack does not adversely affect the flexibility of the sheet.

When an important difference exists between the thermal expansion coefficients of the sheet and the film (typically a difference greater than $5\times10^{-6}$ K$^{-1}$), the material of the sheet is chosen to demonstrate sufficient ductility in order that the transferred film does not suffer damage (for example, of fissure type) during the transfer method. Sufficient ductility is taken to mean that the elastic limit of the sheet is less than the product of the elastic limit of the film and the thickness ratio between the sheet and the film.

Figure 1D:
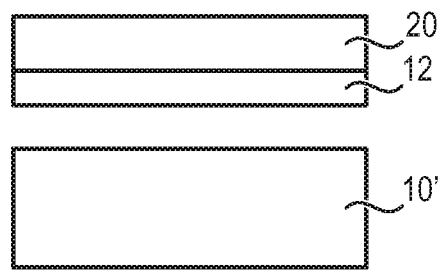
FIG. 1D illustrates in a schematic manner the structure resulting from the detachment of the donor substrate along the embrittlement zone.

With reference to FIG. 1D, the donor substrate 10 is next detached along the embrittlement zone 11, so as to transfer the film 12 onto the flexible sheet 20. At the end of this detachment a residue 10' of the donor substrate remains, which may potentially be recycled with a view to another use.

The detachment is caused by a treatment of the stack of the sheet 20 on the donor substrate 10. The treatment may be, for example, thermal, mechanical or a combination of these two types of treatment. This type of treatment is well known notably within the context of the SMART CUT™ method and thus will not be described in detail here. In the case of a heat treatment, the thermal budget of this treatment is generally greater than the thermal budget of deposition of the flexible sheet.

Figure 1E:
FIG. 1E illustrates the deposition of an additional film on the transferred film at the end of the detachment.

The film 12 may potentially serve as a seed for the deposition of an additional film 13 (cf. FIG. 1E).

The structure formed of the flexible sheet 20 and the film 12 (and a potential additional film) may be used to form devices, which notably have applications in microelectronics, photonics or optics. Such a structure may also enter into the manufacture of sensors or transducers, or membranes for fuel cells.

Below are described several examples (non-limiting) of application of the method according to the present disclosure.

EXAMPLE 1

Formation of a Lithium Niobate Film on a Copper Sheet

Lithium niobate is a piezoelectric and pyroelectric material remarkable in that it conserves its piezoelectric properties up to high temperatures. Its Curie temperature is around 1140° C., whereas numerous other materials lose their properties at temperatures on the order of 100° C to 250° C. It thus represents an interesting material for systems exploiting piezoelectricity and/or pyroelectricity in these temperature ranges.

For example, they may be systems for recovering energy by recovery of the energy of vibrations and other deformations of a mechanical system operating in a hostile environment in temperature ranges above 250° C. They may also be piezo or pyroelectric sensors dedicated to the measurement of mechanical deformation, temperature or to the exchange of data by emission/reception of radiofrequency waves.

To do so, the lithium niobate film has to be able to deform sufficiently easily. This material is monocrystalline and of good quality when it is produced by drawing out of ingots then cut into bulk wafers of several hundreds of µm thickness. In thin films, when it is produced by deposition, it is in general polycrystalline, at best quasi-monocrystalline but with high concentrations of defects. Having available thin films of lithium niobate of good quality on a flexible sheet makes it possible to address application fields such as portable or wearable sensors (integrated in textiles, for example), and the "Internet of Things" (IoT). These examples are not limiting.

Figure 2A:
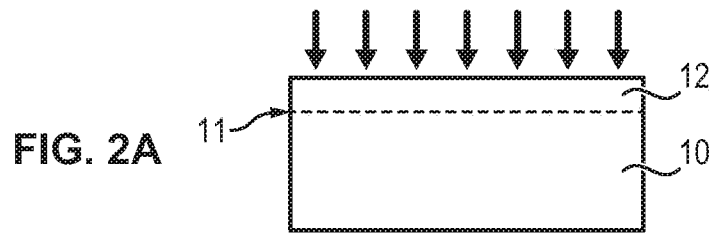
FIG. 2A illustrates in a schematic manner the formation of an embrittlement zone in the donor substrate.

Helium ions are implanted in a lithium niobate substrate 10 so as to form an embrittlement zone 11 and delimit a thin $LiNbO_3$ film 12 (cf. FIG. 2A). The thickness of the film 12 is on the order of 1 µm.

Figure 2B:
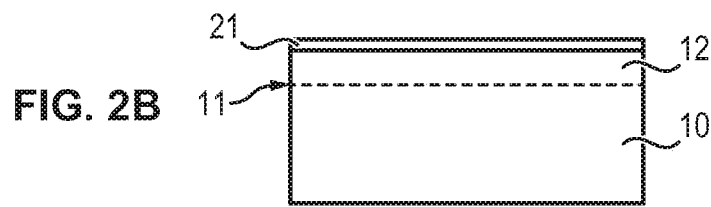
FIG. 2B illustrates in a schematic manner the deposition of an intermediate layer on the donor substrate of FIG. 2A.
Figure 2C:
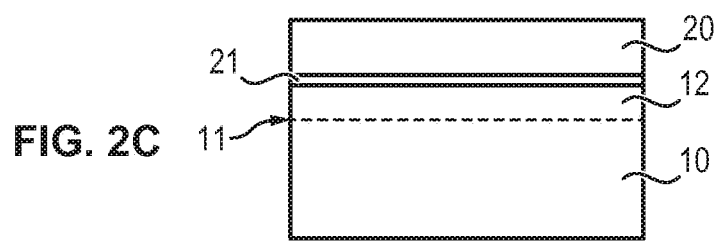
FIG. 2C illustrates in a schematic manner the deposition of the flexible receiving sheet on the intermediate layer of FIG. 2B.

An adhesion layer 21 constituted of a Cr/Cu alloy is deposited on the film 12 by a PVD technique (cf. FIG. 2B). A copper sheet 20 is next deposited on the adhesion layer, by an electrochemical deposition technique (cf. FIG. 2C). The thickness of the sheet is on the order of 20 µm.

Figure 2D:
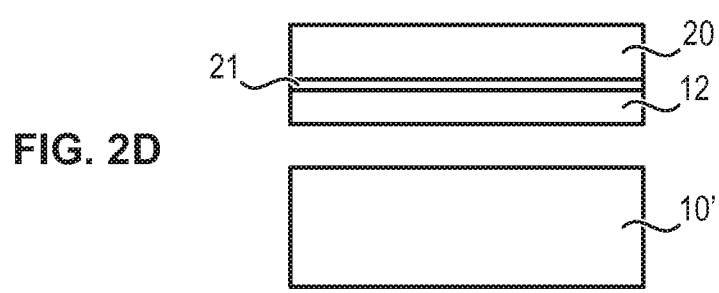
FIG. 2D illustrates in a schematic manner the structure resulting from the detachment of the donor substrate along the embrittlement zone.

Next, an annealing is applied at a temperature of 300° C., in order to cause the detachment of the donor substrate 10 along the embrittlement zone 11 (cf. FIG. 2D).

EXAMPLE 2

Formation of a yttrium stabilized zirconia Film on a Sheet of Nickel

Yttrium stabilized zirconia is generally in the form of polycrystalline ceramic, and more rarely in the form of monocrystalline substrate.

One use of this material is based on its ion conduction properties. It then serves as solid membrane to play the role of electrolyte in SOFC (Solid Oxide Fuel Cell) systems. Such systems, when they have to be miniaturized (this is then known as micro-SOFC), have interest to evolve on the one hand to thin membranes, typically below several µm thickness, and on the other hand to monocrystalline materials. Such systems operate at high temperature (typically 550° C. -700° C.) and are subjected to strong thermomechanical loads. In order to make the membrane more resistant, it will advantageously be given the possibility of deforming slightly.

A monocrystalline YSZ substrate 10 is supplied.

Hydrogen ions are implanted in the substrate 10 so as to form an embrittlement zone 11 and delimit a thin YSZ film 12 (cf. FIG. 2A). The thickness of the film 12 is on the order of 1 μm.

An adhesion layer 21 constituted of a Cr/Cu alloy is deposited on the film 12 by a PVD technique (cf. FIG. 2B). A nickel sheet 20 is next deposited on the adhesion layer by an electrochemical deposition technique (cf. FIG. 2C). The thickness of the sheet is on the order of 20 μm.

Next, an annealing is applied at a temperature of 300° C., in order to cause the detachment of the donor substrate 10 along the embrittlement zone 11 (cf. FIG. 2D).

EXAMPLE 3

Formation of a Monocrystalline Silicon Film on a Curved Glass Sheet

In the field of the production of screens or other optical parts (lenses, mirrors, etc.), the production of non-flat or curved parts makes the use of thin films of monocrystalline materials such as silicon difficult. This example aims to make available a thin silicon film on a glass sheet having a certain curvature. This silicon film could serve to produce high performance transistors, for example, for the purposes of producing high definition ultra-compact and curved screens.

A bulk monocrystalline silicon substrate 10 is supplied.

Figure 3A:
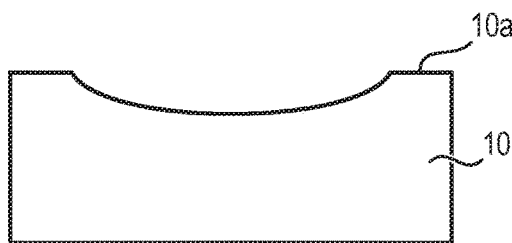
FIG. 3A illustrates in a schematic manner a donor substrate having a curved surface.

The curved shape that it is wished to follow is produced by etching in this silicon substrate. In the case of FIG. 3A, the shape chosen is concave with a more pronounced rise on the edges. Any other profil—parabolic, elliptic, corrugated, etc.—will be possible. This shape could be produced thanks to an etching by mechanical machining. Those skilled in the art will know how to adapt the etching technique to that most suited to the desired shape and dimension.

Figure 3B:
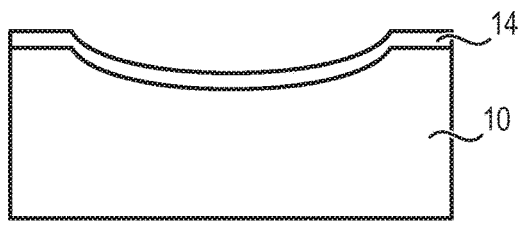
FIG. 3B illustrates the formation of an oxide layer on the surface of the donor substrate of FIG. 3A.
Figure 3C:
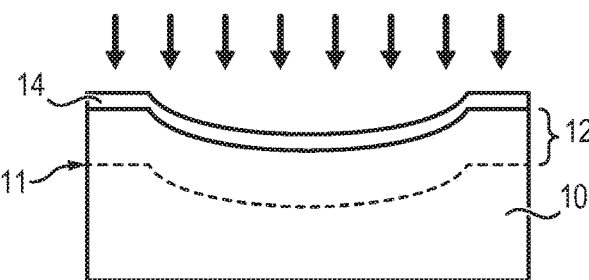
FIG. 3C illustrates the formation of an embrittlement zone in the substrate of FIG. 3B.

The substrate 10 is subjected to a thermal oxidation to produce a $SiO_2$ layer 14 of 0.2 μm thickness (cf. FIG. 3B). Hydrogen ions are next implanted in the substrate 10 so as to form an embrittlement zone 11 and delimit a thin film 12 of monocrystalline silicon (cf. FIG. 3C). The thickness of the film 12 is of the order of 0.5 μm.

Figure 3D:
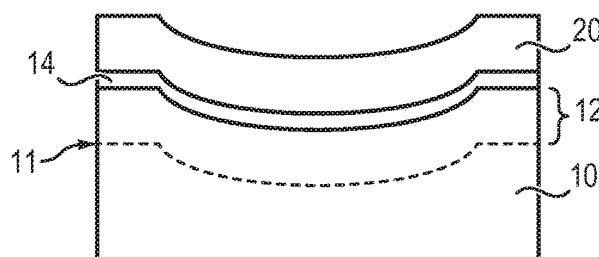
FIG. 3D illustrates in a schematic manner the deposition of the flexible sheet on the donor substrate of FIG. 3C.

A sheet 20 made of silica, in other words made of glass, is deposited on the film 12 by a deposition technique at low temperature, typically below 200° C. so as not to cause an untimely detachment along the embrittlement zone (cf. FIG. 3D). The thickness of the sheet is of the order of 20 μm. Those skilled in the art will know how to choose in these conditions the deposition technique the most suited notably in terms of temperature and desired final thickness.

Figure 3E:
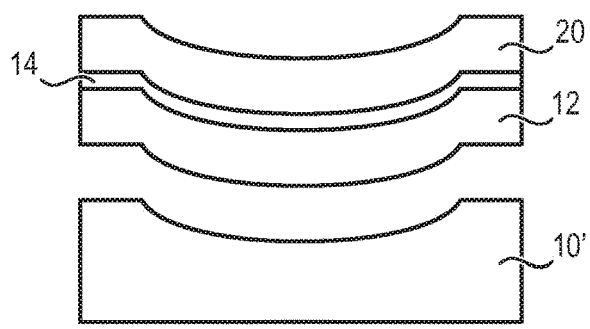
FIG. 3E illustrates in a schematic manner the structure resulting from the detachment of the donor substrate along the embrittlement zone.

Next, an annealing is applied at a temperature of 500° C., in order to cause the detachment of the donor substrate 10 along the embrittlement zone 11 (cf. FIG. 3E).

EXAMPLE 4

Example 4 targets acoustic wave structures such as radiofrequency (RF) filters, for example. In certain structures it is sought to avoid reflections of parasitic waves on the rear face of the substrates and or layers considered. One means consists in making geometrically imperfect the interfaces and rear surfaces, notably by introducing voluntary texturing or other types of roughness. This constraint is difficult or even impossible to satisfy if the use of certain thin films of monocrystalline materials such as $LiTaO_3$, for example, are contemplated, and this is so without resorting to the introduction of complex stacks of additional intermediate layers. Example 4 targets such an object.

A bulk monocrystalline $LiTaO_3$ substrate 10 is supplied.

Figure 4A:
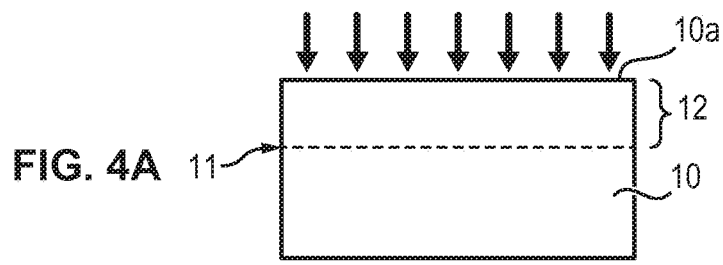
FIGS. 4A-4D illustrate in a schematic manner the steps of a method according to another embodiment of the present disclosure, involving the formation of a non-flat topology of the surface of the film to transfer.

Hydrogen ions are implanted in the substrate 10 through the surface 10a so as to form an embrittlement zone 11 and delimit a thin film 12 of monocrystalline $LiTaO_3$ (cf. FIG. 4A). The thickness of the film 12 is on the order of 1.5 μm.

Figure 4B:
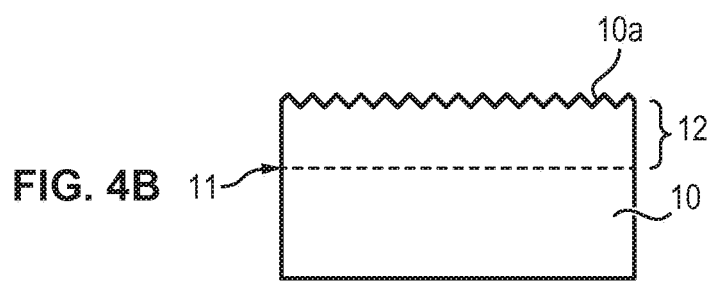

A texturing of the surface 10a is created by photolithoetching (cf. FIG. 4B). In this example, the implantation takes place before the texturing step, but it could take place after.

Those of ordinary skill in the art will know how to adapt the technique to that most suited to the shape and dimensions desired for the texture. It is possible, for example, to choose a nanoimprint lithography technique to define patterns of characteristic slightly submicronic lateral dimensions, over a depth on the order of 0.05 μm. In an alternative, the texturing is obtained by roughening by cathodic sputtering effect. According to another alternative, preferably implemented before the implantation step, the texturing may be obtained by a sanding of the surface of the substrate 10.

Figure 4C:
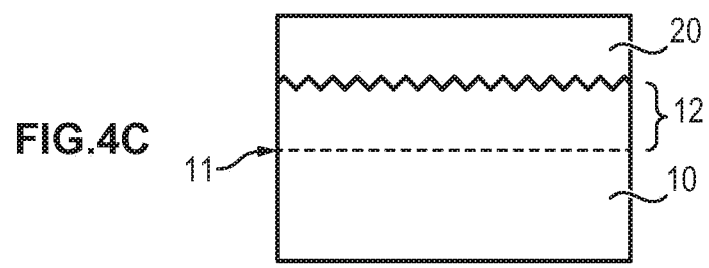

A sheet 20 made of silica is deposited on the film 12 by a low temperature deposition technique, typically below 100° C. so as not to cause premature detachment along the embrittlement zone (cf. FIG. 4C). The thickness of the sheet is on the order of 10 μm. Those of ordinary skill in the art will know how to choose in these conditions the most suitable deposition technique notably in terms of temperature and desired final thickness. As an alternative, the sheet 20 may be made of metal instead of being made of silica.

Figure 4D:
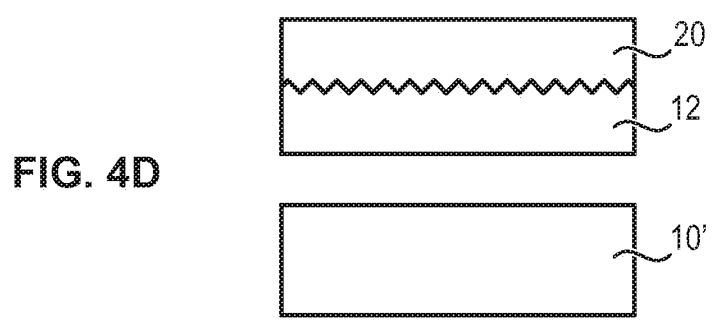

Next, an annealing is applied at a temperature on the order of 200° C., in order to cause the detachment of the donor substrate 10 along the embrittlement zone 11 (cf. FIG. 4D).

EXAMPLE 5

Case of a Donor Substrate Comprising a Plurality of Pads

Figure 5A:
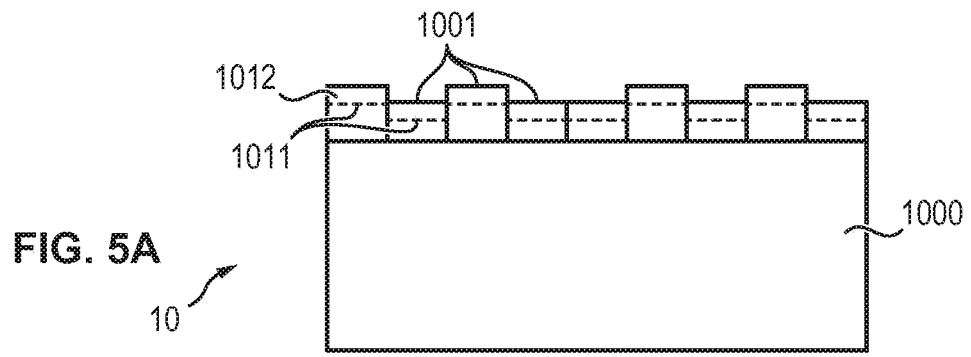
FIGs. 5A-5C illustrate in a schematic manner the steps of a method according to another embodiment of the present disclosure.

According to one embodiment of the present disclosure, the non-flat topology of the donor substrate results from the formation of a plurality of pads 1001 laid out on the surface of a wafer 1000 (cf. FIG. 5A).

The pads are advantageously formed of a material selected from semiconductor materials, piezoelectric materials, magnetic materials and functional oxides. The pads are advantageously monocrystalline. Each pad may be put in place on the wafer by bonding, individually or collectively.

The pads may have any appropriate size and shape as a function of the targeted application. The pads may be laid out in a regular manner on the wafer, for example, to form a sort of grid pattern.

The main surface of each pad 1001 is parallel to the main surface of the wafer 1000. However, in so far as the thickness of each pad is not controlled with sufficient precision, there may exist a slight difference in thickness from one pad to the next (for example, on the order of 1 or 2 μm thickness). As a result, the surface constituted of all of the surfaces of the pads has differences in levels, typically in the form of steps (the amplitude of these variations has been voluntarily exaggerated in FIG. 5A). These different steps thus form a non-flat topology of the surface of the wafer.

In general, as described, for example, in the documents FR 3 041 364 and U.S. Pat. No. 6,562,127, the pads are intended for the transfer of a superficial monocrystalline film onto a final support. To this end, an embrittlement zone 1011 is formed in each pad, before or after its putting in place on the wafer, to delimit a respective film 1012 to transfer, for example, by an implantation as described above.

Figure 5B:
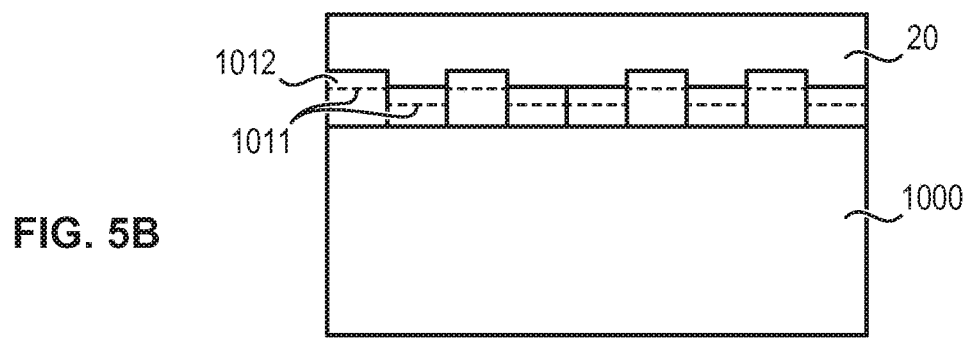

Unlike the methods described in the aforementioned documents, which involve bonding of the main face of each pad on the final support, the present disclosure describes depositing the flexible sheet 20 on all of the pads laid out on the surface of the wafer (cf. FIG. 5B). One is thus free of problems of assembly linked to the difference in height of the different pads.

Figure 5C:
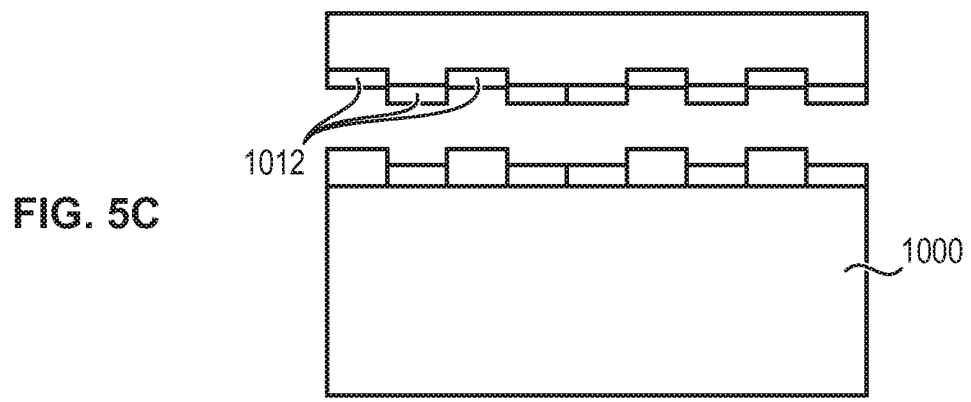

Next, each pad is detached along the respective embrittlement zone 1011, so as to transfer the corresponding film 1012 onto the flexible sheet 20 (cf. FIG. 5C).

Advantageously, the transferred films are more rigid than the flexible sheet. Consequently, if the use of the composite structure thereby obtained involves deforming it in a permanent or dynamic manner, the sheet constitutes a flexible junction between the pads, which absorbs the stresses due to these deformations instead of transmitting them to the pads.

Whatever the embodiment considered, at the end of the detachment of the donor substrate, a residue 10' remains.

If a recycling of the donor substrate is desired, it is possible to implement reconditioning operations, notably with the aim of regenerating the surface of the donor substrate, which could have been damaged during the detachment. These operations may notably comprise steps of cleaning, etching, annealing, smoothing and planarization, for example, by polishing.

In the case where the donor substrate has a particular topology (curvature, roughness, texturing, etc.) that has been produced before the embrittlement step, the residue of the donor substrate has a topology identical to the initial topology of the donor substrate. It may appear advantageous for purposes of cost to conserve this topology that had been initially created in the donor substrate, with a view to avoiding reforming it systematically after each recycling. In this case, planarization methods are avoided, while favoring methods for removing material conformal in thickness, or even with substantially zero removal of material (that is to say below 30 nm), such as, for example, plasma etchings or smoothing annealings.

The invention claimed is:

1. A method for manufacturing a film, on a flexible sheet, the method comprising the following steps:
   providing a donor substrate;
   forming an embrittlement zone in the donor substrate so as to delimit the film, the film having a thickness between 100 nm and 10 µm;
   forming the flexible sheet by deposition over a surface of the film; and
   detaching the donor substrate along the embrittlement zone so as to transfer the film onto the flexible sheet.

2. The method of claim 1, wherein the formation of the embrittlement zone is carried out by implantation of ionic species into the donor substrate.

3. The method of claim 2, wherein the implanted ionic species are hydrogen and/or helium.

4. The method of claim 1, wherein the detachment of the donor substrate is caused by a heat treatment.

5. The method of claim 1, wherein the film comprises at least one material selected from among: semiconductor materials, piezoelectric materials, magnetic materials and functional oxides.

6. The method of claim 1, wherein the flexible sheet comprises at least one material selected from among: metals, glasses and ceramics.

7. The method of claim 1, wherein the flexible sheet has a thickness between 1 and 50 µm.

8. The method of claim 1, wherein the deposition of the flexible sheet is implemented by at least one technique selected from among: physical vapor deposition, chemical vapor deposition, electrochemical deposition, spin coating, lacquering and spraying.

9. The method of claim 1, wherein the flexible sheet has a rigidity (R) between 100 GPa.µm³ and $10^6$ GPa.µm³, the rigidity being defined by the formula:

$$R = \frac{E \times H^3}{12 \times (1 - v^2)}$$

where E is the Young's modulus of a material of the flexible sheet, H is a thickness of the flexible sheet, and v is the Poisson coefficient.

10. The method of claim 1, further comprising, before the formation of the flexible sheet, the formation of an intermediate layer by deposition over the surface of the film.

11. The method of claim 10, wherein the intermediate layer is configured to increase an adherence of the flexible sheet to the film.

12. The method of claim 10, wherein the intermediate layer forms an electrical contact with the film.

13. The method of claim 1, further comprising, after the detachment of the donor substrate, the deposition of an additional film on a face of the transferred film opposite to the flexible sheet.

14. The method of claim 1, further comprising recycling a remaining portion of the donor substrate after the detachment and reusing the donor substrate to form a new film.

15. The method of claim 14, wherein the donor substrate has a non-flat surface obtained before the formation of the embrittlement zone and wherein, before the recycling, the donor substrate is subjected to an operation of regeneration of its surface involving a removal of material from the donor substrate.

16. The method of claim 1, wherein the donor substrate comprises a plurality of pads laid out on a surface of a wafer, each pad comprising an embrittlement zone delimiting a respective film to be transferred, and the flexible sheet is deposited on a respective surface of each of the pads of the plurality.

17. The method of claim 1, wherein the film is a monocrystalline film.

18. A method for manufacturing a film, on a flexible sheet, the method comprising the following steps:
   providing a donor substrate;
   forming an embrittlement zone in the donor substrate so as to delimit the film;
   forming the flexible sheet by deposition over a surface of the film, the flexible sheet having a thickness between 1 and 50 µm; and
   detaching the donor substrate along the embrittlement zone so as to transfer the film onto the flexible sheet.

19. The method of claim 18, wherein the flexible sheet comprises at least one material selected from among: metals, glasses and ceramics.

20. The method of claim 18, wherein the deposition of the flexible sheet is implemented by at least one technique selected from among: physical vapor deposition, chemical vapor deposition, electrochemical deposition, spin coating, lacquering and spraying.

21. The method of claim 18, wherein the flexible sheet has a rigidity (R) between 100 GPa.μm³ and 10⁶ GPa.μm³, the rigidity being defined by the formula:

$$R = \frac{E \times H^3}{12 \times (1 - v^2)}$$

where E is the Young's modulus of a material of the flexible sheet, H is a thickness of the flexible sheet, and v is the Poisson coefficient.

22. The method of claim 18, further comprising, before the formation of the flexible sheet, the formation of an intermediate layer by deposition over the surface of the film.

23. The method of claim 22, wherein the intermediate layer is configured to increase an adherence of the flexible sheet to the film.

24. The method of claim 22, wherein the intermediate layer forms an electrical contact with the film.

* * * * *